(12) United States Patent
Lin

(10) Patent No.: US 12,113,008 B1
(45) Date of Patent: Oct. 8, 2024

(54) SEMICONDUCTOR CHIP PACKAGE INCLUDING LEAD FRAME AND MANUFACTURING METHOD THEREOF

(71) Applicant: Diodes Incorporated, Plano, TX (US)

(72) Inventor: Shiau-Shi Lin, New Taipei (TW)

(73) Assignee: Diodes Incorporated, Plano, TX (US)

( * ) Notice: Subject to any disclaimer, the term of this patent is extended or adjusted under 35 U.S.C. 154(b) by 0 days.

(21) Appl. No.: 18/423,257

(22) Filed: Jan. 25, 2024

Related U.S. Application Data

(63) Continuation of application No. PCT/CN2023/136936, filed on Dec. 7, 2023.

(30) Foreign Application Priority Data

Jul. 26, 2023 (CN) .......................... 202310935359.7

(51) Int. Cl.
 *H01L 21/48* (2006.01)
 *H01L 23/00* (2006.01)
 (Continued)

(52) U.S. Cl.
 CPC .... *H01L 23/49838* (2013.01); *H01L 21/4839* (2013.01); *H01L 23/49811* (2013.01); *H01L 23/49861* (2013.01); *H01L 24/32* (2013.01); *H01L 24/83* (2013.01); *H01L 24/45* (2013.01); *H01L 24/48* (2013.01); *H01L 24/49* (2013.01); *H01L 24/73* (2013.01); *H01L 24/92* (2013.01); *H01L 2224/32257* (2013.01); *H01L 2224/45147* (2013.01); *H01L 2224/48091* (2013.01); *H01L 2224/48245* (2013.01); *H01L 2224/4903* (2013.01); *H01L 2224/49051* (2013.01);
 (Continued)

(58) Field of Classification Search
 CPC ......... H01L 23/49861; H01L 23/49838; H01L 21/4839
 USPC ............................................ 257/676; 438/123
 See application file for complete search history.

(56) References Cited

U.S. PATENT DOCUMENTS

| 8,093,694 B2 | 1/2012 | Ong |
| 8,236,612 B2 | 8/2012 | San Antonio et al. |

(Continued)

FOREIGN PATENT DOCUMENTS

| JP | H0661276 A | 3/1994 |
| JP | 2007096042 A | 4/2007 |

(Continued)

OTHER PUBLICATIONS

International Search Report and Written Opinion received in Patent Cooperation Treaty Application No. PCT/CN2023/136936, dated Mar. 28, 2024.

(Continued)

*Primary Examiner* — Didarul A Mazumder
(74) *Attorney, Agent, or Firm* — AP3 Law Firm PLLC

(57) ABSTRACT

A semiconductor chip package may include a lead frame having a first surface and a second surface opposite to each other. A groove may be provided on the first surface of the lead frame and filled with an adhesive. A semiconductor chip may be disposed over the first groove and affixed on the first surface of the lead frame through the adhesive in the first groove. A carrier may be disposed on the second surface of the lead frame. A method for manufacturing the semiconductor chip package is also provided.

19 Claims, 14 Drawing Sheets

(51) Int. Cl.
  *H01L 23/49* (2006.01)
  *H01L 23/498* (2006.01)
(52) U.S. Cl.
  CPC .............. *H01L 2224/73265* (2013.01); *H01L 2224/83192* (2013.01); *H01L 2224/92247* (2013.01); *H01L 2924/12032* (2013.01); *H01L 2924/13055* (2013.01); *H01L 2924/13062* (2013.01); *H01L 2924/13091* (2013.01)

(56) References Cited

U.S. PATENT DOCUMENTS

| | | |
|---|---|---|
| 9,190,353 B2 | 11/2015 | Ching, Jr. et al. |
| 2002/0163015 A1 | 11/2002 | Lee et al. |
| 2003/0042592 A1 | 3/2003 | Zverev et al. |
| 2006/0175689 A1 | 8/2006 | Shim et al. |
| 2007/0075404 A1* | 4/2007 | Dimaano, Jr. ....... H01L 23/3107 257/E23.037 |
| 2008/0111221 A1* | 5/2008 | Anderson ............ H01L 24/49 257/676 |
| 2009/0261468 A1* | 10/2009 | Kroeninger .......... H01L 25/072 257/E23.001 |
| 2013/0099270 A1* | 4/2013 | Kobayashi ............ C25D 5/10 257/98 |
| 2013/0147024 A1* | 6/2013 | Goh .................... H01L 23/3107 257/676 |
| 2014/0021634 A1* | 1/2014 | Nikitin ............ H01L 23/49827 257/774 |
| 2015/0287667 A1 | 10/2015 | Pan et al. |
| 2017/0352603 A1* | 12/2017 | Ichiryu ............ H01L 21/4839 |
| 2021/0111108 A1* | 4/2021 | Singer ............... H01L 23/49524 |
| 2022/0077051 A1 | 3/2022 | Chu et al. |
| 2022/0093486 A1* | 3/2022 | Reiter ............... H01L 23/49811 |

FOREIGN PATENT DOCUMENTS

| | | |
|---|---|---|
| TW | 200705519 A | 2/2007 |
| TW | 201037808 A | 10/2010 |

OTHER PUBLICATIONS

Office Action and Search Report from Taiwan Patent Application No. 112141051, dated Jul. 2, 2024, 10 pages.

* cited by examiner

SEMICONDUCTOR CHIP PACKAGE INCLUDING LEAD FRAME AND MANUFACTURING METHOD THEREOF

CROSS-REFERENCE TO RELATED APPLICATIONS

This patent application is a continuation of International Application No. PCT/CN2023/136936, filed on Dec. 7, 2023 and entitled "Semiconductor chip package and manufacturing method thereof," which claims priority to Chinese Patent Application No. 202310935359.7, filed on Jul. 26, 2023 and entitled "Semiconductor chip package and manufacturing method thereof." The aforementioned applications are hereby incorporated by reference herein as if reproduced in their entireties.

TECHNICAL FIELD

The present disclosure relates generally to the field of semiconductors, and in particular embodiments, to techniques and mechanisms for a semiconductor chip package and a manufacturing method thereof. In particular embodiments, a semiconductor chip package having a lead frame is provided.

BACKGROUND

A semiconductor chip can be mounted on a chip pad of a lead frame by use of adhesive and electrically connected to lead contacts of the lead frame by use of conductive wires. A molding compound may then be formed to encapsulate the power chip and the lead frame. With miniaturization of the package structures, the area of the chip pad is reduced, and the distance from the power chip to the edge of the chip pad is also shortened, which may cause the adhesive to overflow. In addition, lead frames are typically thin and have fine patterns, and may be damaged or deformed by mechanical or thermal force during the manufacturing process. It would be desirable to avoid the adhesive overflow and improve the stability of the lead frames, and to improve manufacturing quality.

SUMMARY

Technical advantages are generally achieved, by embodiments of this disclosure which describe a semiconductor chip package and a manufacturing method thereof.

Embodiments of the present disclosure relate to a semiconductor chip package. The semiconductor chip package includes: a lead frame having a first side and a second side opposite to each other, the lead frame having a first groove provided on the first side of the lead frame; an adhesive filled in the first groove; and a semiconductor chip disposed on the first side of the lead frame and the adhesive; wherein the width of the first groove is no larger than that of the semiconductor chip.

Embodiments of the present disclosure relate to a semiconductor chip package. The semiconductor chip package includes: a lead frame having a first side and a second side opposite to each other, the lead frame having a first groove formed on the first side of the lead frame; an adhesive filled in the first groove; a semiconductor chip disposed on the first side of the lead frame and the adhesive; and a carrier disposed on the second side of the lead frame.

Embodiments of the present disclosure relate to a method of manufacturing a semiconductor chip package. The method includes: obtaining a lead frame having a first side and a second side opposite to each other, the lead frame having a first groove provided on the first side of the lead frame; filling the first groove with an adhesive; and disposing a semiconductor chip on the first side of the lead frame and on the first groove, wherein a width of the first groove is no larger than a width of the semiconductor chip.

In accordance with one aspect of the present disclosure, a semiconductor chip package is provided that includes: a lead frame having a first surface and a second surface opposite to each other; a first groove provided on the first surface of the lead frame and filled with an adhesive; and a semiconductor chip disposed over the first groove and affixed on the first surface of the lead frame through the adhesive in the first groove.

In accordance with another aspect of the present disclosure, a semiconductor chip package is provided that includes: a lead frame having a first surface and a second surface opposite to each other, with a first groove provided on the first surface of the lead frame; an adhesive filled in the first groove; a semiconductor chip disposed on the first surface and the adhesive; and a carrier provided on the second surface of the lead frame carrying the lead frame and the semiconductor chip.

In accordance with yet another aspect of the present disclosure, a method for manufacturing a semiconductor chip package is provided. The method includes: obtaining a lead frame, the lead frame having a first surface and a second surface opposite to each other, with a first groove provided on the first surface of the lead frame; filling an adhesive in the first groove; and disposing a semiconductor chip on the first surface and the adhesive, the semiconductor chip covering the first groove.

BRIEF DESCRIPTION OF THE DRAWINGS

Aspects of embodiments of the present disclosure may be better understood from the following detailed description in conjunction with accompanying drawings. It should be noted that various structures may not be drawn to scale. In fact, the dimensions of the various structures may be enlarged or reduced at will for clarity of illustration.

For a more complete understanding of the present disclosure, and the advantages thereof, reference is now made to the following descriptions taken in conjunction with the accompanying drawings, in which.

Identical or similar components are labeled with the same reference numbers in the drawings and detailed description. Embodiments of the present disclosure will be readily understood from the following detailed description taken in conjunction with the accompanying drawings.

DETAILED DESCRIPTION OF ILLUSTRATIVE EMBODIMENTS

Figure 1A:
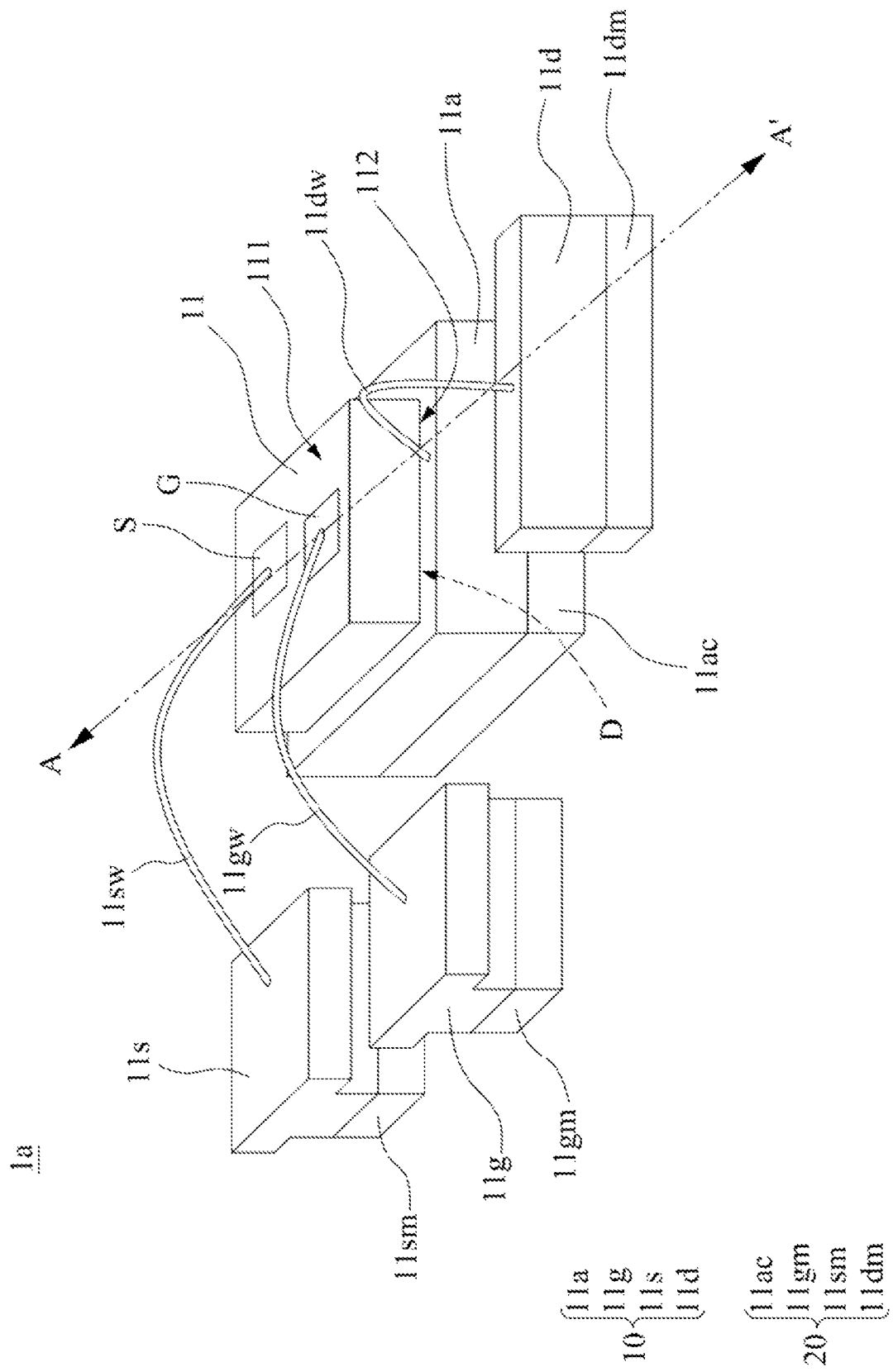
FIG. 1A is a perspective view of a portion of an example semiconductor chip package according to some embodiments of the present disclosure.

The making and using of embodiments of this disclosure are discussed in detail below. It should be appreciated, however, that the concepts disclosed herein can be embodied in a wide variety of specific contexts, and that the specific embodiments discussed herein are merely illustrative and do not serve to limit the scope of the claims. Further, it should be understood that various changes, substitutions and alterations can be made herein without departing from the spirit and scope of this disclosure as defined by the appended claims.

Further, one or more features from one or more of the following described embodiments may be combined to create alternative embodiments not explicitly described, and features suitable for such combinations are understood within the scope of this disclosure. It is therefore intended that the appended claims encompass any such modifications or embodiments.

The following disclosure provides various different embodiments or examples for implementing different features of the present disclosure. Specific embodiments of components and configurations are described below. Certainly, these are examples only and are not intended to be limiting. In the present disclosure, references to forming a first feature over or on a second feature may include embodiments where the first and second features are formed in direct contact, and may also include embodiments where an additional feature is formed between the first feature and the second feature such that the first feature and the second feature may not be in direct contact. In addition, the present disclosure may repeat reference signs and/or letters of the drawings in various embodiments. Such repetition is for simplicity and clarity and does not in itself indicate a relationship between the various embodiments and/or configurations discussed.

Embodiments of the present disclosure are discussed in detail below. It should be appreciated, however, that the present disclosure provides applicable concepts that can be embodied in a wide variety of specific contexts. The specific embodiments discussed herein are illustrative only, and do not limit the scope of the present disclosure.

Embodiments of the present disclosure provide a semiconductor chip package and a manufacturing method thereof.

In the semiconductor chip package of the embodiments of the present disclosure, a semiconductor chip is mounted on a chip pad of a lead frame through an adhesive, and is electrically connected to lead contacts of the lead frame via conductive members (e.g., wires or copper strips). The adhesive is filled in a groove of the chip pad. This prevents the adhesive from overflowing and improves stability of the lead frame, thereby improving the manufacturing yield.

Further, in the manufacturing process of the semiconductor chip package of embodiments of the present disclosure, a clamp is used to fix the lead frame on a carrier, to avoid causing wireframe warping. The part of the carrier that is used to carry the chip pad may be made of a material having a relatively high thermal conductivity, which improves the thermal conductivity of semiconductor chip packages.

Figure 1B:
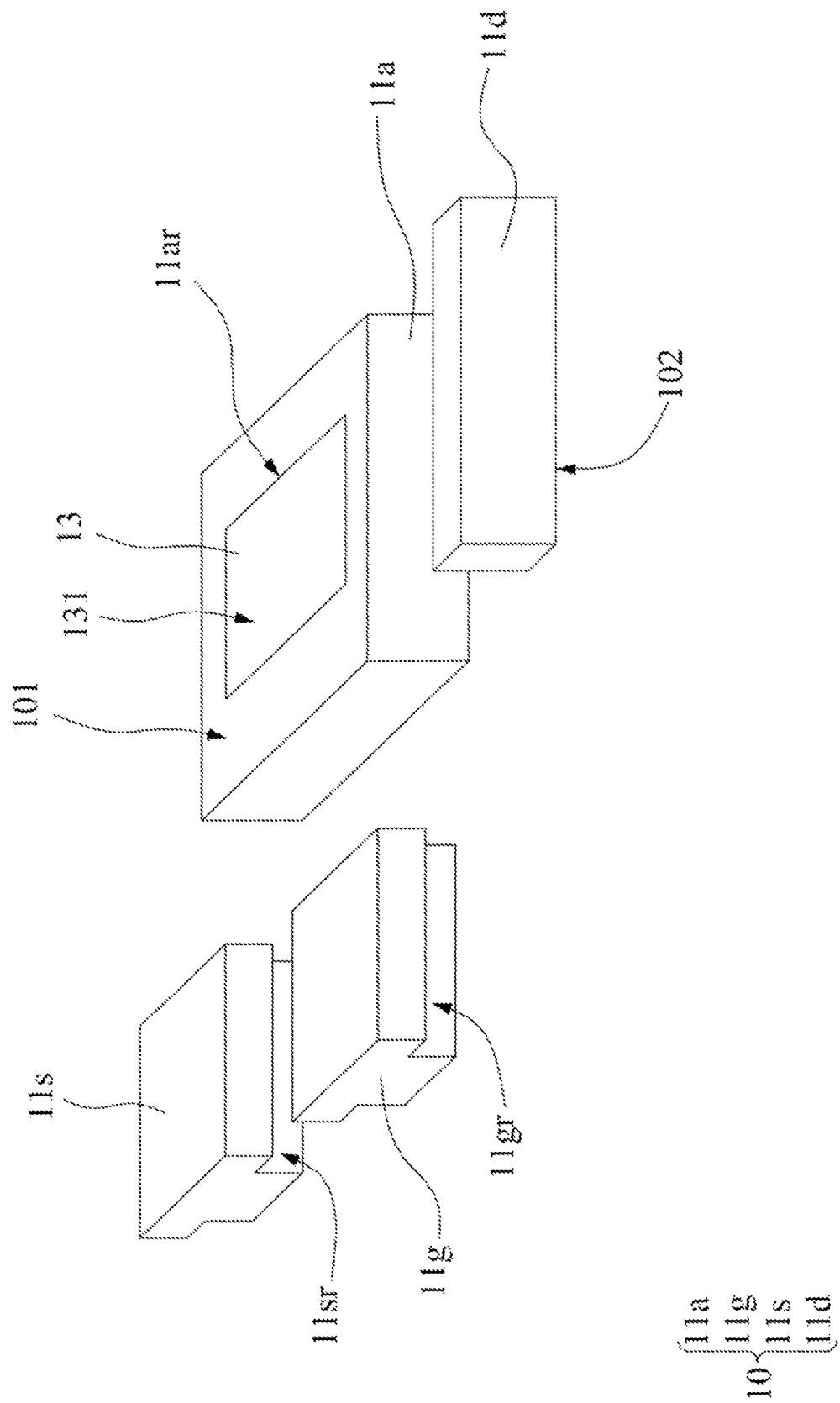
FIG. 1B is a perspective view of a portion of the example semiconductor chip package according to some embodiments of the present disclosure.
Figure 1C:
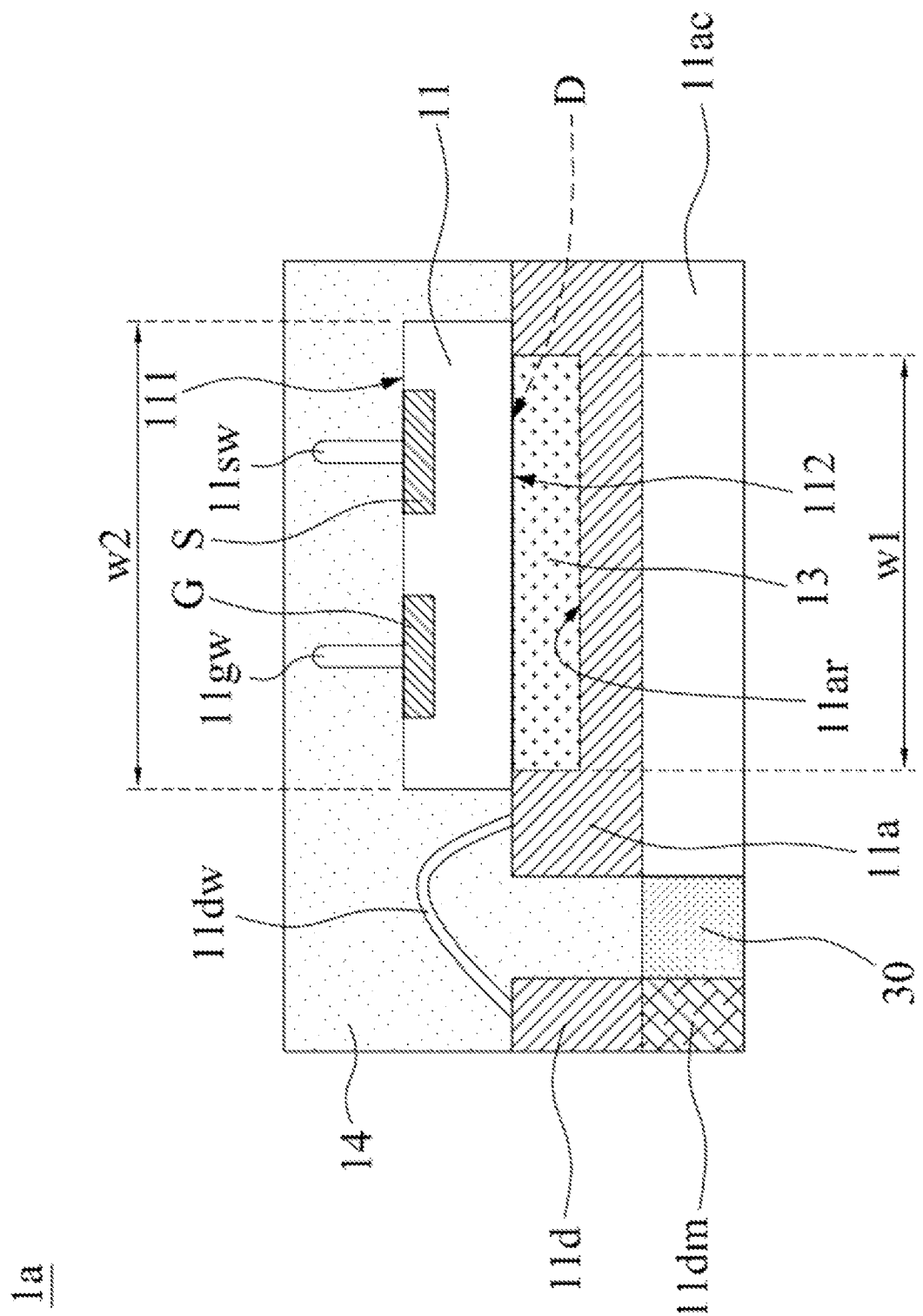
FIG. 1C is a cross-sectional view of the example semiconductor chip package according to some embodiments of the present disclosure.

The following description will be provided with reference to FIG. 1A-FIG. 1C. FIG. 1A is a perspective view of a portion of an example semiconductor chip package 1a according to embodiments of the present disclosure.

The semiconductor chip package 1a may include a carrier 20, a lead frame 10, and a semiconductor chip 11. The carrier 20, the lead frame 10 and the semiconductor chip 11 may be stacked in one direction on each other. The semiconductor chip 11 and the carrier 20 may be disposed on opposing sides of the lead frame 10.

The carrier 20 may include a portion 11ac with a relatively high thermal conductivity (or referred to as a first portion), and portions 11gm, 11sm and 11dm with a relatively low thermal conductivity (or referred to as a second portion). The portions 11ac, 11gm, 11sm and 11dm may be physically separated. The portions 11ac, 11gm, 11sm and 11dm may not be directly in contact with each other. The portions 11ac, 11gm, 11sm and 11dm may be separated from each other through an insulation layer (e.g., an insulation layer 30 in FIG. 1C).

The portion 11ac may overlap the semiconductor chip 11. For example, the portion 11ac, a portion of the lead frame 10 (e.g., a chip pad 11a) and the semiconductor chip 11 may be stacked on each other in one direction. Each of the portions 11gm, 11sm and 11dm may not overlap with the semiconductor chip 11.

Dimensions (e.g., width, thickness, area, and so on) of the portions 11ac, 11gm, 11sm and 11dm may be the same as or different from each other. The width of the portion 11ac may be greater than the width of the portion 11gm, the portion 11sm or the portion 11dm. Further, the thicknesses of the portions 11ac, 11gm, 11sm and 11dm may be the same as each other.

The portion 11ac may include ceramic materials, e.g., including oxides (such as beryllium oxide (BeO), aluminum oxide ($Al_2O_3$)), nitride (such as aluminum nitride (AlN), silicon nitride ($Si_3N_4$)), boride (such as boron nitride (BN)), carbide (such as carbon silicon (SiC)), other ceramic materials (such as diamond (C)), or a combination of two or more thereof. The thermal conductivity of the portion 11ac may be above 100 $Wm^{-1}K^{-1}$, above 150 $Wm^{-1}K^{-1}$, above 200 $Wm^{-1}K^{-1}$ or higher. For example, the portion 11ac may include aluminum nitride (AlN), and may have a thermal conductivity between 170 $Wm^{-1}K^{-1}$ and 230 $Wm^{-1}K^{-1}$.

The portion 11ac may be configured to conduct heat of the semiconductor chip 11 to the outer environment through a portion of the lead frame 10 (e.g., the chip pad 11a). The thermal conductivity may be increased by at least 10% when using the portion 11ac having a relatively high thermal conductivity, if compared with an example embodiment that does not use a material having a relatively high thermal conductivity, and thus the effect of reducing the device resistance is achieved.

The portions 11gm, 11sm and 11dm may include metallic materials, e.g., including electrically conductive materials such as metals, metal alloys, silicon metals, and so on. Examples of the electrically conductive materials may include gold (Au), silver (Ag), copper (Cu), platinum (Pt), palladium (Pd), tungsten (W), titanium (Ti), tantalum (Ta), molybdenum (Mo), other metals or alloys, or a combination of two or more thereof.

The portions 11gm, 11sm and 11dm may be configured as external terminals for electrical connections between the semiconductor chip package 1a and external devices (e.g., a printed circuit board (PCB), other packages and/or other electrical components).

In some embodiments, the portion 11ac may include a metallic material, such as the materials described above with respect to the portions 11gm, 11sm, and 11sm.

The lead frame 10 may include the chip pad 11a, a gate lead contact 11g, a source lead contact 11s, and a drain lead contact 11d. The chip pad 11a, the gate lead contact 11g, the source lead contact 11s and the drain lead contact 11d may be physically separated. The chip pad 11a, the gate lead contact 11g, the source lead contact 11s and the drain lead contact 11d may not be in direct contact with each other. The chip pad 11a, the gate lead contact 11g, the source lead contact 11s and the drain lead contact 11d may be separated from each other by an encapsulant (e.g., an encapsulant 14 in FIG. 1C).

Dimensions (e.g. width, thickness, area, and so on) of the chip pad 11a, the gate lead contact 11g, the source lead contact 11s and the drain lead contact 11d may be the same as or different from each other. The width of the chip pad 11a may be larger than the width of the gate lead contact 11g, the source lead contact 11s or the drain lead contact 11d. In addition, the thicknesses of the chip pad 11a, the gate lead contact 11g, the source lead contact 11s and the drain lead contact 11d may be the same as each other.

The lead frame 10 may include metallic materials, e.g., including electrically conductive materials such as metals, metal alloys, and so on. Examples of the electrically conductive material may include gold (Au), silver (Ag), copper (Cu), platinum (Pt), palladium (Pd), other metals or alloys, or two or more combinations thereof.

The chip pad 11a may be configured to carry the semiconductor chip 11. For example, the semiconductor chip 11 may be disposed on the chip pad 11a. The gate lead contact 11g, the source lead contact 11s, and the drain lead contact 11d each may be configured to be coupled to (or electrically connected to) electrical terminals of the semiconductor chip 11. The gate lead contact 11g, the source lead contact 11s and the drain lead contact 11d may each be configured to couple (or electrically connect) the electrical terminals of semiconductor chip 11 to external terminals (e.g., the portions 11gm, 11sm and 11dm of the carrier 20).

Referring to FIG. 1B, FIG. 1B illustrates the lead frame 10 of the semiconductor chip package 1a in FIG. 1A.

The lead frame 10 may have a surface (or a first surface, a first side) 101 and a surface (or a second surface, a second side) 102 opposite to each other. The chip pad 11a of the lead frame 10 may have a groove (or a first groove) 11ar recessed from the surface 101 (formed on the surface 101). The gate lead contact 11g and the source lead contact 11s of the lead frame 10 may have grooves (or second grooves) 11gr and 11sr recessed from the surface 102 (formed on the surface 102). Although the groove 11ar in FIG. 1B is shown in a shape of a square or rectangle, the shape is not limited in the present disclosure. In some embodiments, the top view of the groove 11ar may be rectangular, circular, hexagonal or any other shape. In some embodiments, the position, shape, ratio of the occupied area, quantity, and so on, of the groove 11ar may be adjusted in order to apply to different packages.

An adhesive 13 may be filled in the groove 11ar of the chip pad 11a of the lead frame 10. The adhesive 13 may have a surface 131, which may be generally coplanar with the surface 101 of the lead frame 10. The adhesive 13 may include a conductive adhesive, conductive electrical epoxy, and/or solder.

Referring back to FIG. 1A, when the semiconductor chip 11 is placed on the chip pad 11a, the adhesive 13 as shown in FIG. 1B may be completely covered by the semiconductor chip 11, which prevents the adhesive 13 from overflowing and improves the stability of the lead frame 10, thereby improving the manufacturing yield.

The semiconductor chip 11 may include circuit components such as transistors, resistors, capacitors, and interconnect structures to form an integrated circuit (IC). In some embodiments, the semiconductor chip 11 may include a metal-oxide-semiconductor field-effect transistor (MOSFET), such a NMOS, PMOS, CMOS, a voltage feedback device and/or a switch. In some embodiments, the semiconductor chip 11 may include a double-diffused MOSFET (DMOSFET), an insulated-gate bipolar transistor (IGBT), a junction gate field-effect transistor (JFET), a power bipolar transistor or power diode (e.g., a power Schottky diode).

The semiconductor chip 11 may have a surface 111 and a surface 112 opposite to the surface 111. The surface 112 may contact (e.g., directly contact) an adhesive (e.g., the adhesive 13 in FIG. 1B). The surface 112 may contact (e.g., directly contact) a surface of the lead frame 10 (e.g., the surface 101 in FIG. 1B), to conduct heat to the portion 11ac of the carrier 20.

One or more electrical terminals may be exposed from the surface 111 and/or the surface 112 of the semiconductor chip 11. For example, the gate G and source S of the semiconductor chip 11 may be located on the same side of the semiconductor chip 11, and the drain D of the semiconductor chip 11 may be located on the opposite side. As an example, the gate G and source S of the semiconductor chip 11 may be located on the surface 111, and the drain D may be located on the surface 112.

The gate G of the semiconductor chip 11 may be coupled (or electrically connected) to the gate lead contact 11g of the lead frame 10 through a wire 11gw. The gate lead contact 11g may be configured to couple (or electrically connect) the gate G of the semiconductor chip 11 to an external terminal (e.g., the portion 11gm of the carrier 20).

The source S of the semiconductor chip 11 may be coupled (or electrically connected) to the source lead contact 11s of the lead frame 10 through a wire 11sw. The source lead contact 11s may be configured to couple (or electrically connect) the source S of the semiconductor chip 11 to an external terminal (e.g., the portion 11sm of the carrier 20).

The drain D of the semiconductor chip 11 may be coupled (or electrically connected) to the adhesive 13. The drain D of the semiconductor chip 11 may be coupled (or electrically connected) to the drain lead contact 11d of the lead frame 10 through the adhesive 13, the chip pad 11a and a wire 11dw (see FIG. 1C). The drain lead contact 11d may be configured to couple (or electrically connect) the drain D of the semiconductor chip 11 to an external terminal (e.g., the portion 11dm of the carrier 20).

In some embodiments, the wire 11gw, the wire 11sw, and the wire 11dw may be replaced by copper strips or copper sheets, and may connect the electrical terminals of the semiconductor chip 11 to the lead frame 10 using copper clip bond.

In some embodiments, in order to increase the thermal conductivity, a non-electrically conductive ceramic material may be used for the portion 11ac. Because the chip pad 11a is carried on the portion 11ac, the portion 11ac may not be electrically conductive, and thus the wire 11*dw* and the drain lead contact 11*d* are needed to couple (or electrically connect) the drain D of the semiconductor chip 11 to an external terminal (e.g., the portion 11*dm* of the carrier 20). In some embodiments, an electrically conductive metal material may be used for the portion 11*ac* to provide an optimal conductivity path for the drain D.

FIG. 1C is an example cross-sectional view of the semiconductor chip package 1*a* according to embodiments of the present disclosure. In some embodiments, FIG. 1C is a cross-sectional view of the semiconductor chip package 1*a* in FIG. 1A along a line AA'. The same or similar components are referenced with the same symbols, and the detailed description of the same or similar components will not be repeated again.

Referring to FIG. 1C, in addition to the carrier 20, the lead frame 10 and the semiconductor chip 11, the semiconductor chip package 1*a* may also include the encapsulant 14 and the insulation layer 30. In order to clearly show the relationship between the components, the encapsulant 14 and the insulation layer 30 are omitted from the perspective view of FIG. 1A. The cross-sectional view in FIG. 1C omits the portions 11*gm* and 11*sm* of the carrier 20, and the gate lead contact 11*g* and the source lead contact 11*s* of the lead frame 10.

The insulation layer 30 may be filled in the carrier 20. For example, the insulation layer 30 may be filled in between any two portions of the portion 11*ac*, the portion 11*gm*, the portion 11*sm* and the portion 11*dm* of the carrier 20. The insulation layer 30 may contact a portion of the encapsulant 14.

The encapsulant 14 may contact, cover or encapsulate the semiconductor chip 11. Referring to FIG. 1B, the encapsulant 14 may contact, cover or encapsulate the chip pad 11*a*, the gate lead contact 11*g*, the source lead contact 11*s* and the drain lead contact 11*d* of the lead frame 10. The encapsulant 14 may contact, cover, or encapsulate the surface 101 of the lead frame 10. The encapsulant 14 may not be in contact with the adhesive 13. The encapsulant 14 may be filled in the groove 11*gr* and the groove 11*sr* to improve the structural stability of the lead frame 10.

The insulation layer 30 and encapsulant 14 may each include insulating or dielectric materials. Examples of the insulating materials may include epoxy resin with filler, a molding material or molding compound, polyimide, a phenolic compound, a material containing silicone, or any combination thereof. Examples of the dielectric materials may include silicon oxide (SiO2), silicon nitride ($Si_3N_4$), silicon oxynitride ($Si_2N_2O$), borophosphosilicate glass (BPSG), phosphosilicate glass (PSG), undoped silicon glass (USG), fluorosilicate glass (FSG), spin-on glass (SOG), or a combination of any two or more thereof. The insulation layer 30 and the encapsulant 14 may include the same material. The insulation layer 30 and the encapsulant 14 may include different materials.

In some embodiments, the insulation layer 30 may use a ceramic material to reduce the coefficient of thermal expansion (CTE) between the carrier 20 (which may contain a metal material) and the encapsulants 14 (which may contain an insulation material) and improve thermal conductivity.

As described above, the adhesive 13 may be filled in the groove 11*ar* of the chip pad 11*a* of the lead frame 10 and completely covered by the semiconductor chip 11. The width w1 of the adhesive 13 or the groove 11*ar* may be no larger than the width w2 of the semiconductor chip 11. The width w1 of the adhesive 13 or the groove 11*ar* may be generally equal to the width w2 of the semiconductor chip 11. The width w1 of the adhesive 13 or the groove 11*ar* may be smaller than the width w2 of the semiconductor chip 11.

Figure 2A:
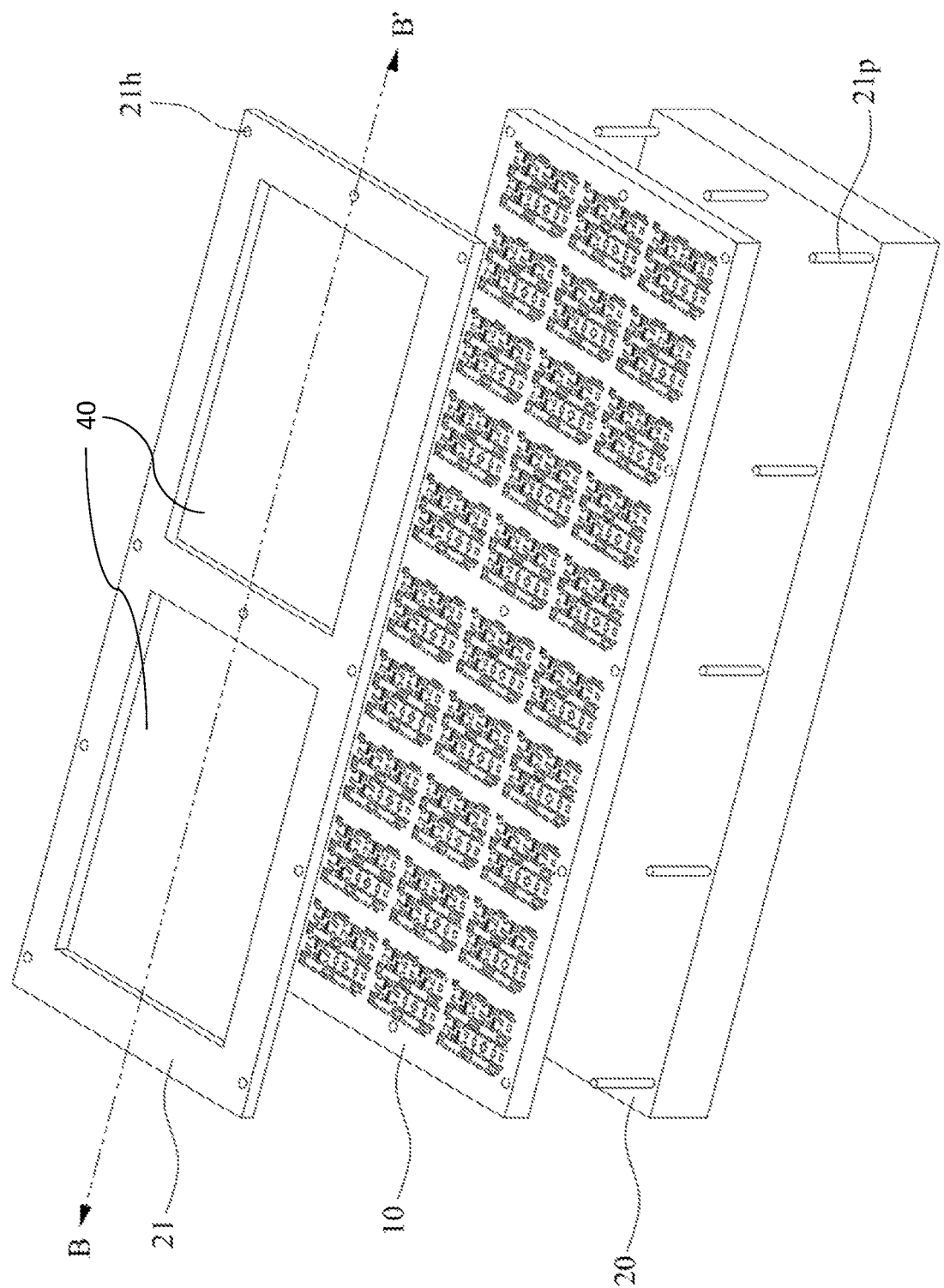
FIG. 2A and FIG. 2B are diagrams illustrating one or more stages in an example manufacturing method of a semiconductor chip package according to some embodiments of the present disclosure.
Figure 2B:
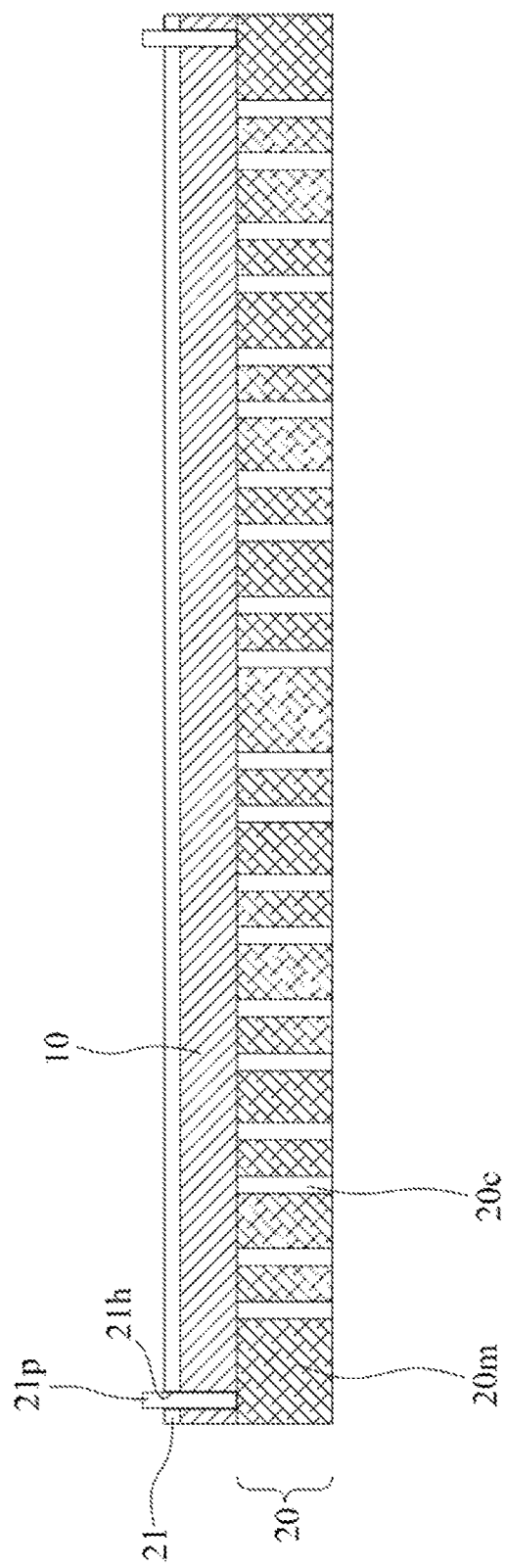

FIG. 2A and FIG. 2B are diagrams illustrating one or more example stages in a manufacturing method of a semiconductor chip package according to some embodiments of the present disclosure. FIG. 2A is a perspective view of a structure of the semiconductor chip package, and FIG. 2B is a cross-sectional view. In some embodiments, FIG. 2B is a cross-sectional view of the structure of FIG. 2A along a line BB'. At least one of FIGS. 2A-2B has been simplified in order to facilitate understanding of aspects of the present disclosure.

Referring to FIG. 2A, the manufacturing method includes obtaining a lead frame 10, and affixing the lead frame 10 on a carrier 20 using a clamping device, e.g., a clamping plate 21, such that the lead frame 10 is clamped between the clamping plate 21 and the carrier 20. The clamping plate 21 and the carrier 20 are arranged on the opposite sides of the lead frame 10. The clamping plate 21 and the lead frame 10 may be provided with a plurality of through-holes 21*h*. Fastening bolts 21*p* may be provided on the carrier 20, which may pass through the through-holes 21*h* such that the clamping plate 21 and the lead frame 10 are affixed to the carrier 20.

The clamping plate 21 may have two openings 40 for exposing a device area of the lead frame 10. The position, shape, ratio of occupied area, quantity, and so on, of the openings may be adjusted in order to be applied to different packages, and are not limited to the aspects depicted in FIG. 2A.

The lead frame 10 may include the device area exposed from the clamping plate 21, and an edge area provided with the through holes 21*h*. The edge area surrounds the device area. The device area may include a plurality of units, and a unit may be segregated from another unit through a single cut. The semiconductor chip package 1*a* as described with respect to FIG. 1A, FIG. 1B, and FIG. 1C may include one unit. A lead frame area 3*a* in FIG. 3A-1 may include two units.

Referring to FIG. 2B, the carrier 20 may include portions (or first portions) 20*c* having a relatively high thermal conductivity and portions (or second portions) 20*m* having a relatively low thermal conductivity. That is, the first portions have a higher thermal conductivity than the second portions. For example, the first portions have a higher thermal conductivity coefficient than that of the second portions. The portions 20*c* may include a ceramic material, such as the materials described above with respect to the portion 11*ac*. The portions 20*m* may include a metal material, such as the materials described with respect to the portion 11*gm*, the portion 11*sm* and the portion 11*dm*. The portions 20*c* and the portions 20*m* may be alternately arranged, as shown. In some embodiments, the positions of the portions 20*c* may correspond to the chip pad of the lead frame 10 for bearing a semiconductor chip.

FIGS. 3A-1, 3A-2, 3B, 3C, 3D-1, 3D-2, 3E-1, 3E-2, 3F, 3G, and 3H are diagrams illustrating one or more example stages in a manufacturing method of a semiconductor chip package according to some embodiments of the present disclosure. At least some of the figures have been simplified for better understanding of aspects of the present disclosure. For the sake of brevity, as shown in the figures, a lead frame area 3*a* of a lead frame 10 including two units is used as an example for illustration of a manufacturing process. A similar manufacturing process may be used for other areas of the lead frame 10.

Figures 2, 3A:
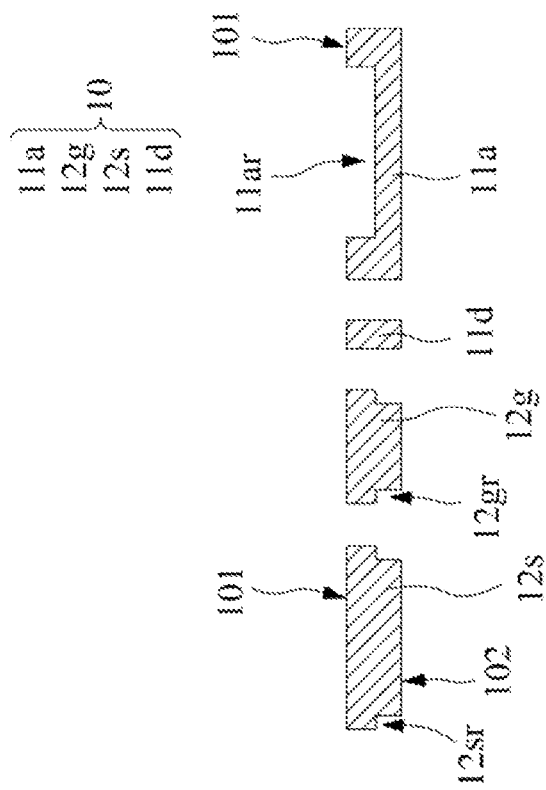
FIGS. 3A-1, 3A-2, 3B, 3C, 3D-1, 3D-2, 3E-1, 3E-2, 3F, 3G, and 3H are diagrams illustrating one or more stages in another example manufacturing method of a semiconductor chip package according to some embodiments of the present disclosure.
Figures 1, 3A:
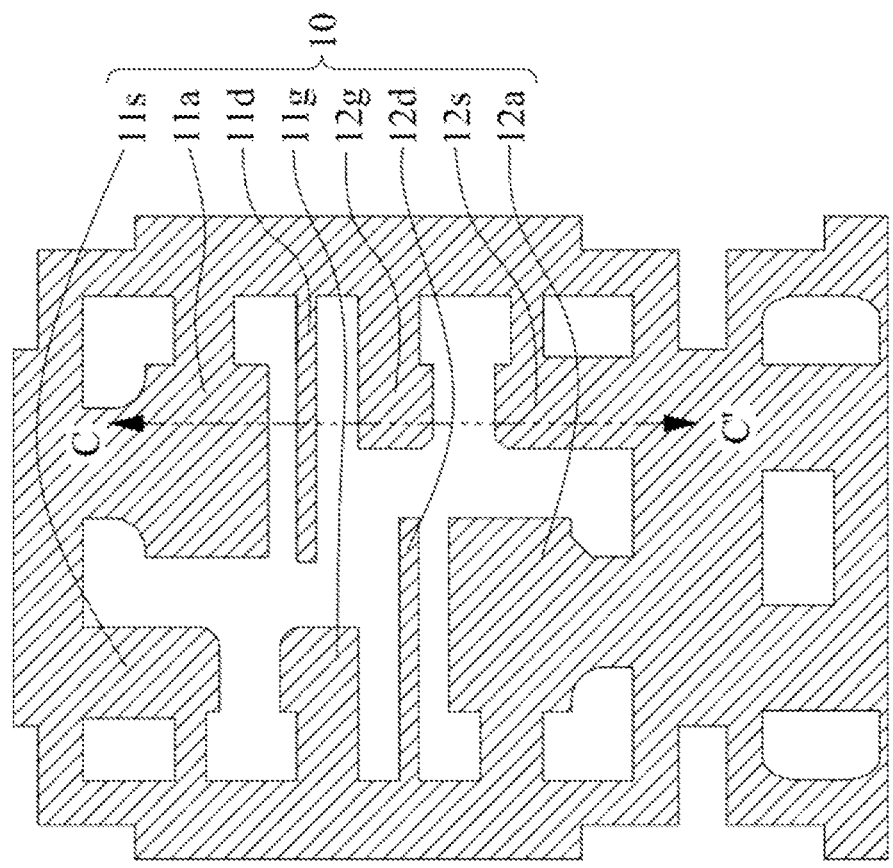

Referring to FIG. 3A-1 and FIG. 3A-2, in some embodiments, FIG. 3A-2 is a cross-sectional view of the lead frame area 3a of the lead frame 10 in FIG. 3A-1 along a line CC'. The manufacturing method includes obtaining the lead frame 10. The lead frame 10 may include, before being cut for singulation, interconnected chip pads 11a and 12a, gate lead contacts 11g and 12g, source lead contacts 11s and 12s, and drain lead contacts 11d and 12d. The chip pad 12a may be configured to carry another semiconductor chip (e.g., a semiconductor chip 12 in FIG. 3D-1). The gate lead contact 12g, the source lead contact 12s and the drain lead contact 12d each may be configured to couple (or electrically connect) to electrical terminals of another semiconductor chip. The gate lead contact 12g, the source lead contact 12s and the drain lead contact 12d may each be configured to couple (or electrically connect) the electrical terminals of another semiconductor chip to external terminals (e.g., portions 12gm and 12sm of a carrier 20 in FIG. 3G). As shown in FIG. 3A-2, the chip pad 11a of the lead frame 10 may have a groove 11ar formed on a surface 101 of the lead frame 10. The gate lead contact 12g and the source lead contact 12s of the lead frame 10 may have respective grooves 12gr and 12sr recessed from a surface 102 of the lead frame 10.

Figure 3B:
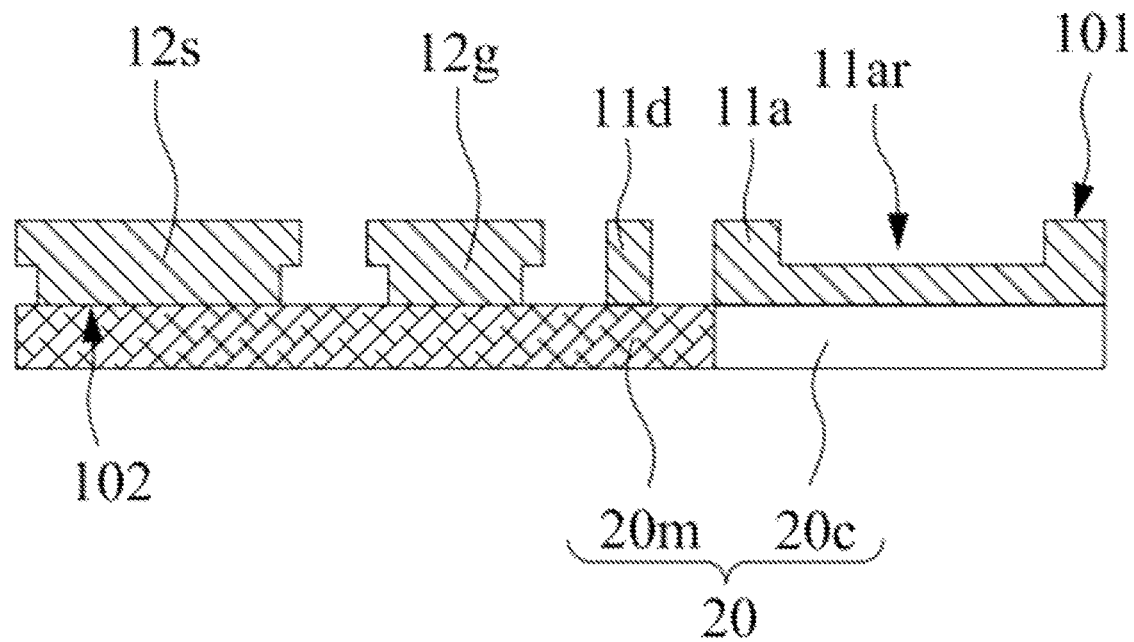

Referring to FIG. 3B, the manufacturing method includes disposing a carrier 20 on the surface 102 of the lead frame 10. The position of a portion 20c of the carrier 20 may correspond to the chip pad 11a of the lead frame 10. In some embodiments, the manufacturing method may include passing fastening bolts (for example, the fastening bolts 21p as described with respect to FIG. 2A) through through-holes of the lead frame 10 (for example, the through-holes 21h in FIG. 2A). In some embodiments, the manufacturing method may include using a clamp (e.g., the clamping plate 21 in FIG. 2A) to affix the lead frame 10 on the carrier 20.

Figure 3C:
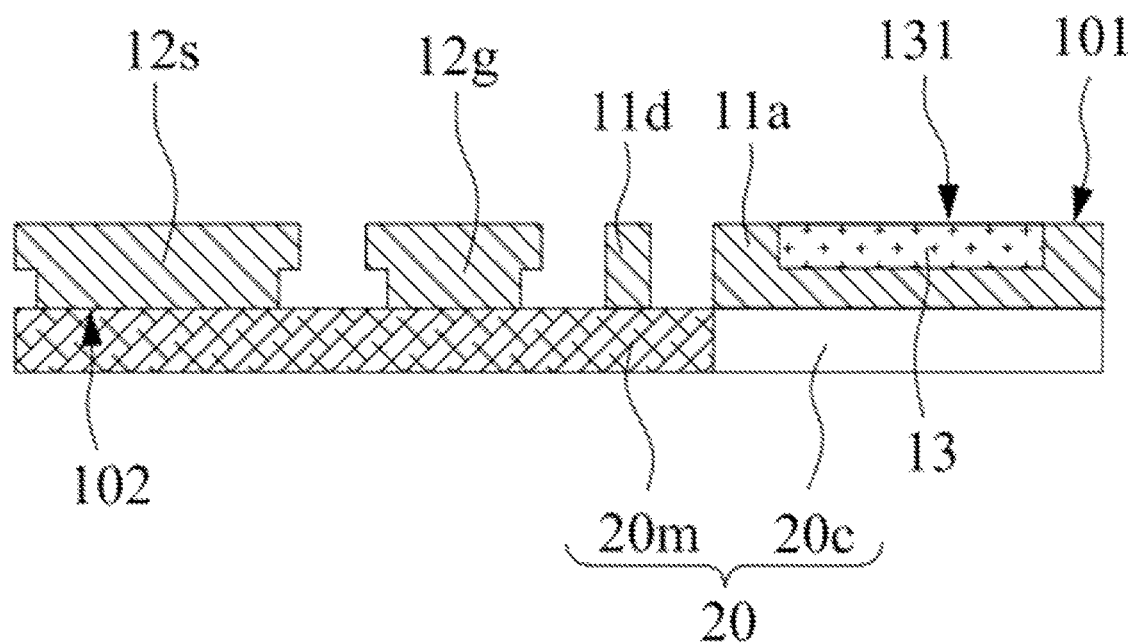

Referring to FIG. 3C, the manufacturing method includes filling the groove 11ar with an adhesive 13. In some embodiments, the adhesive 13 may be formed through screen printing or dispensing. The adhesive 13 may have a surface 131 that is generally coplanar with the surface 101 of the lead frame 10.

Figures 2, 3D:
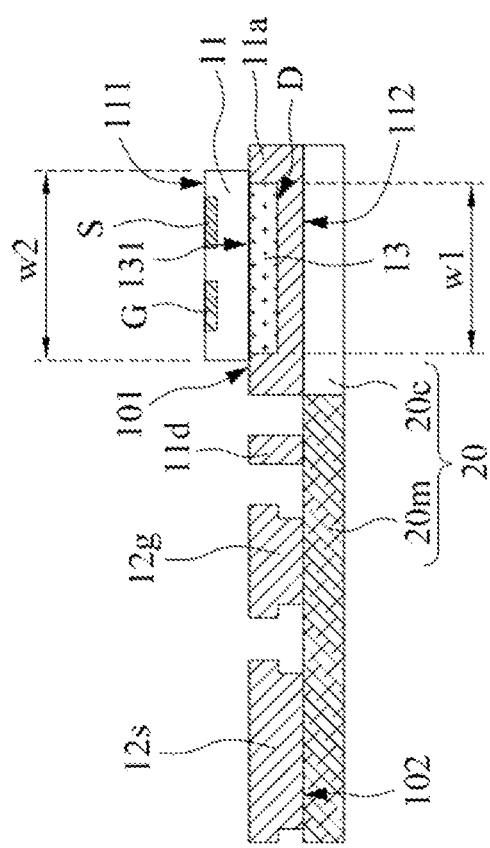
Figures 1, 3D:
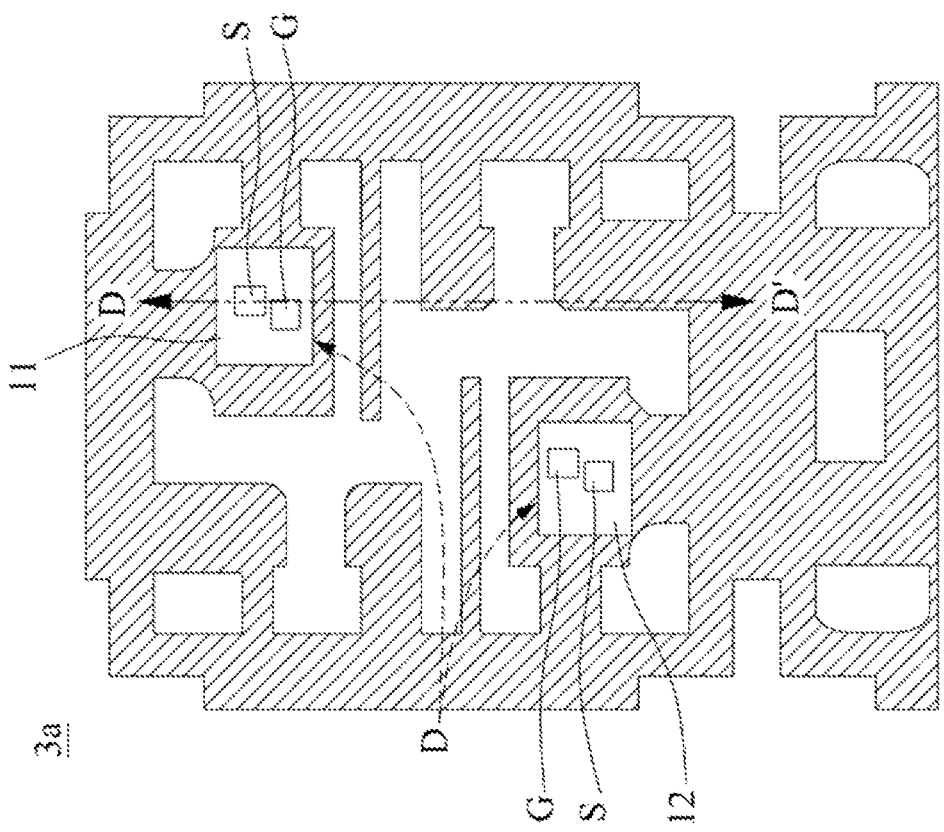

Referring to FIG. 3D-1 and FIG. 3D-2, in some embodiments, FIG. 3D-2 is a cross-sectional view of the lead frame area 3a of the lead frame 10 in FIG. 3D-1 along a line DD'. The manufacturing method includes arranging a semiconductor chip 11 on the surface 101 of the lead frame 10 and the adhesive 13. In some embodiments, the manufacturing method may further include providing a semiconductor chip 12. The gate G and source S of the semiconductor chip 12 may be located at the same side of the semiconductor chip 12, and the drain D of the semiconductor chip 12 may be located on the opposing side. For detailed description of the semiconductor chip 12, reference may be made to that of the semiconductor chip 11, and the description will not be repeated here. As shown in FIG. 3D-2, the adhesive 13 may be completely covered by the semiconductor chip 11. The width w1 of the adhesive 13 or the groove 11ar may be no larger than the width w2 of the semiconductor chip 11. The width w1 of the adhesive 13 or the groove 11ar may be generally equal to the width w2 of the semiconductor chip 11. The width w1 of the adhesive 13 or the groove 11ar may be smaller than the width w2 of the semiconductor chip 11.

Figures 1, 2, 3E:
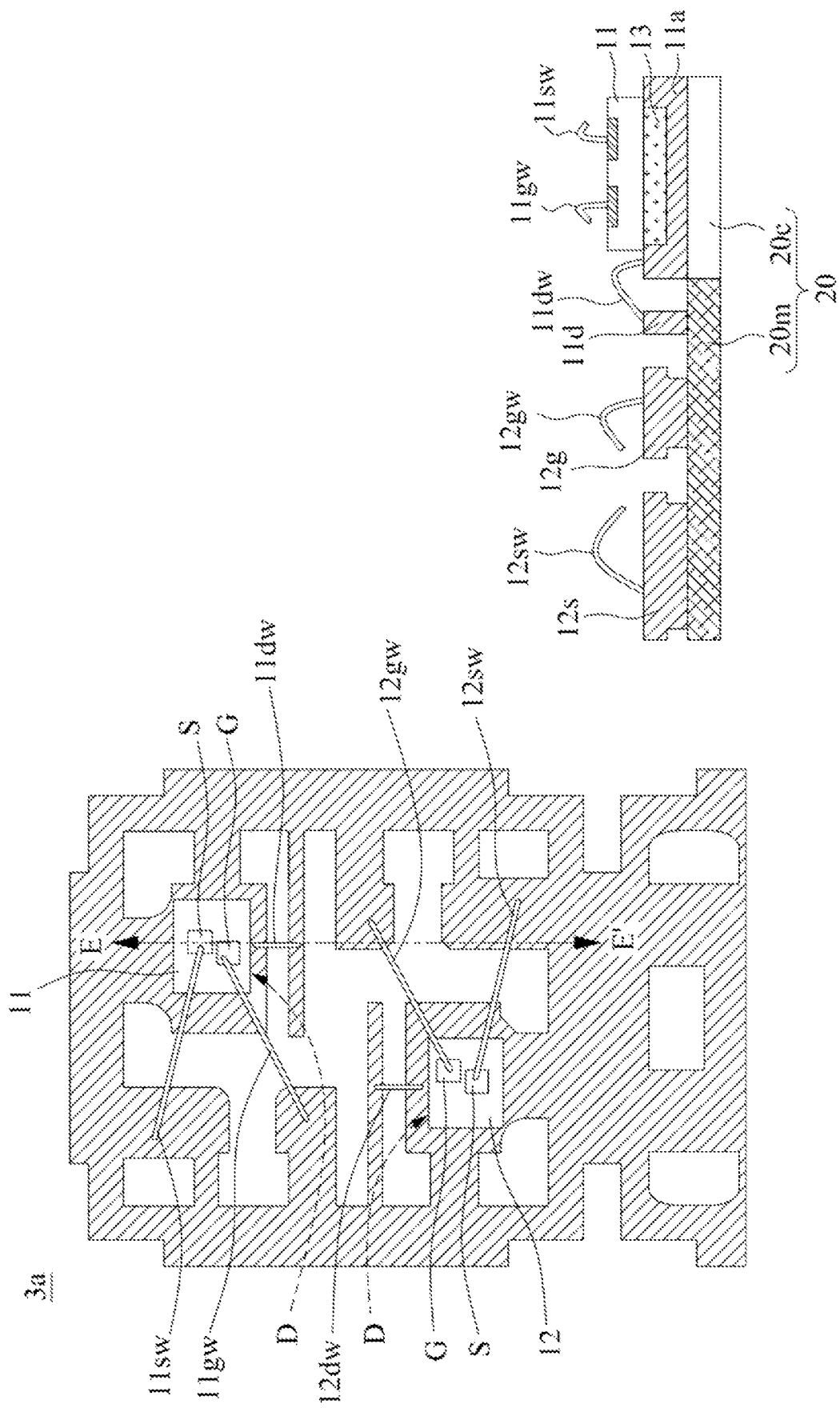

Referring to FIG. 3E-1 and FIG. 3E-2, in some embodiments, FIG. 3E-2 is a cross-sectional view of the lead frame area 3a of the lead frame 10 in FIG. 3E-1 along a line EE'. The manufacturing method may include forming wires to couple (or electrically connect) the electrical terminals of the semiconductors chip 11. For example, the gate G of the semiconductor chip 11 may be coupled (or electrically connected) to the gate lead contact 11g of the lead frame 10 via the wire 11gw. The source S of the semiconductor chip 11 may be coupled (or electrically connected) to the source lead contact 11s of the lead frame 10 via the wire 11sw. The drain D of the semiconductor chip 11 may be coupled (or electrically connected) to the drain lead contact 11d of the lead frame 10 via the adhesive 13, the chip pad 11a and the wire 11dw.

In some embodiments, the manufacturing method may further include forming wires to couple (or electrically connect) electrical terminals of the semiconductor chip 12. For example, the gate G of the semiconductor chip 12 may be coupled (or electrically connected) to the gate lead contact 12g of the lead frame 10 via the wire 12gw. The source S of the semiconductor chip 12 may be coupled (or electrically connected) to the source lead contact 12s of the lead frame 10 via the wire 12sw. The drain D of the semiconductor chip 12 may be coupled (or electrically connected) to the drain lead contact 12d of the lead frame 10 via adhesive, the chip pad 12a and the wire 12dw.

Figure 3F:
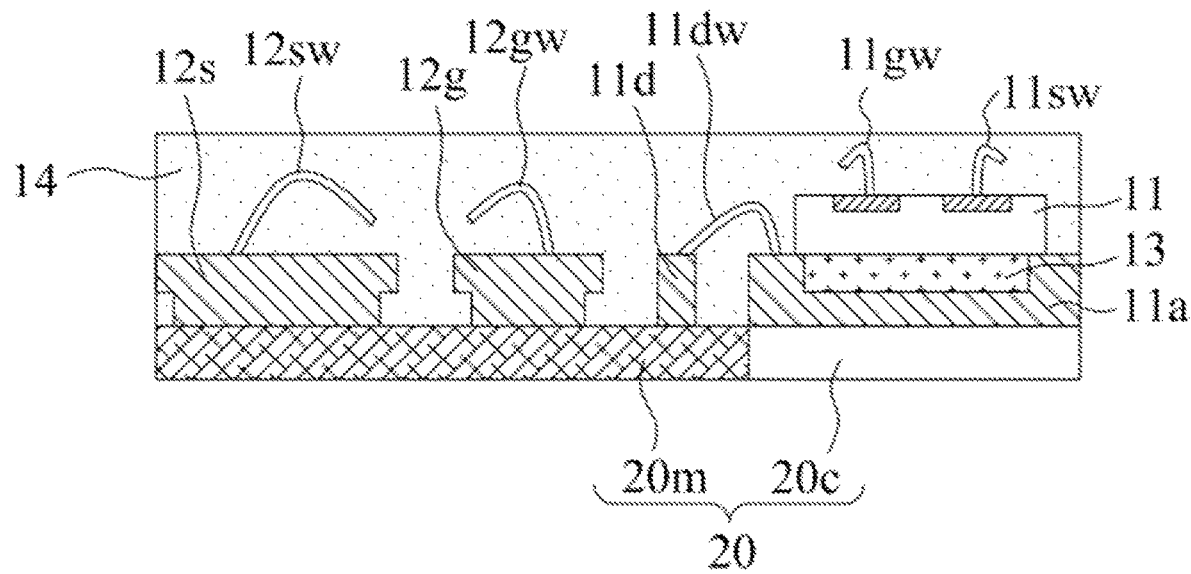

Referring to FIG. 3F, the manufacturing method may include covering, with an encapsulant 14, the lead frame 10, the semiconductor chip 11 and other semiconductor chips (e.g., the semiconductor chip 12 in FIG. 3E-1). The encapsulant 14 may be filled in grooves recessed from the surface 102, e.g., the groove 12gr and the groove 12sr in FIG. 3A-2, and the groove 11gr and the groove 11sr in FIG. 1B. In some embodiments, the encapsulant 14 may be formed by molding, e.g., formed by printing, compression molding, transfer molding, liquid encapsulant molding, vacuum lamination, spin coating, or other applicable processes.

Figure 3G:
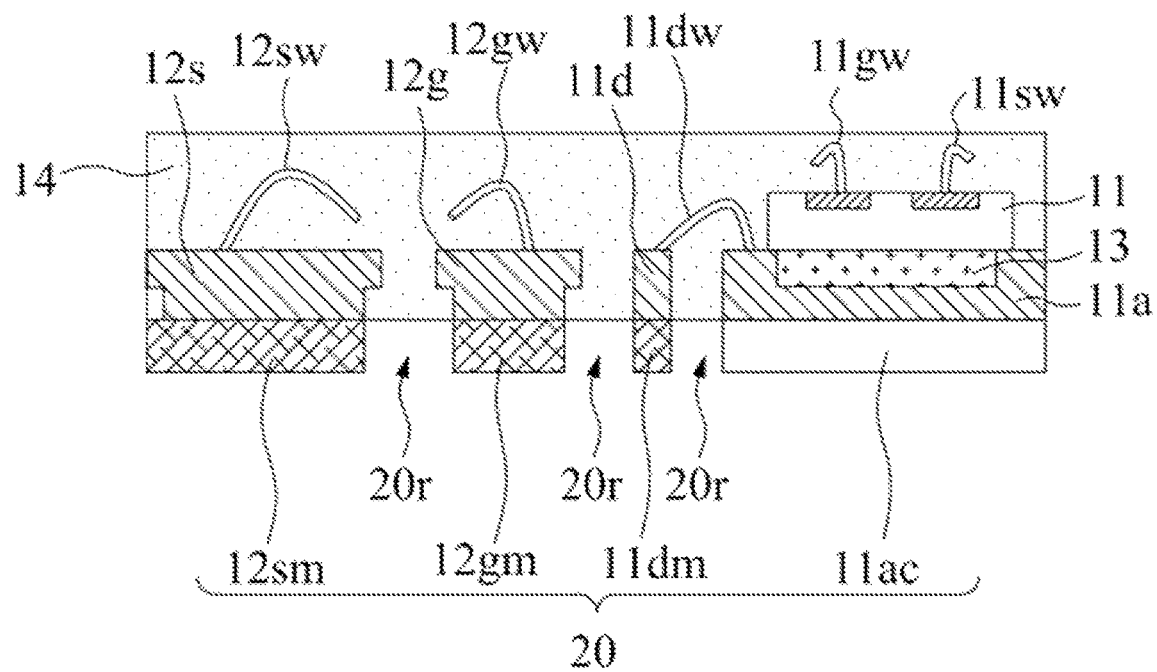

Referring to FIG. 3G, the manufacturing method includes removing portion(s) of the carrier 20 to form groove(s) 20r. In some embodiments, the manufacturing method may include removing a portion of the carrier 20 that has a relatively low thermal conductivity (or a metal portion, e.g., the portion 20m in FIG. 3B), such that portions with a relatively high thermal conductivity (or ceramic portions, e.g., the portion 20c in FIG. 3B) are not in contact with portions with a relatively low thermal conductivity. As shown in FIG. 3G, the portion with the relatively high thermal conductivity (or ceramic portion, e.g., the portion 20c in FIG. 3B) is separated from the other portions of the carrier 20 to form the portion 11ac. In some embodiments, the width of the portion 11ac may be generally the same as the width of the chip pad 11a.

The portions with the relatively low thermal conductivity (or metal portions, e.g., the portion 20m in FIG. 3B) are separated from each other to form the portion 11dm, the portion 12gm and the portion 12sm. The portion 11dm and the portion 11ac are a portion of the semiconductor chip package 1a in FIG. 1A. The portion 12gm and the portion 12sm are a portion of a package of another semiconductor chip (e.g., the semiconductor chip 12 in FIG. 3E-1).

In some embodiments, the groove(s) 20r may be formed using a laser drilling process. In some embodiments, the groove(s) 20r may expose a portion of the encapsulant 14. In some embodiments, a groove 20r may have a width that is generally the same, in the direction of the thickness. In some embodiments, the groove(s) 20r may have different slopes, may be gradually wider toward the encapsulant 14, or may be gradually narrower toward the encapsulant 14.

Figure 3H:
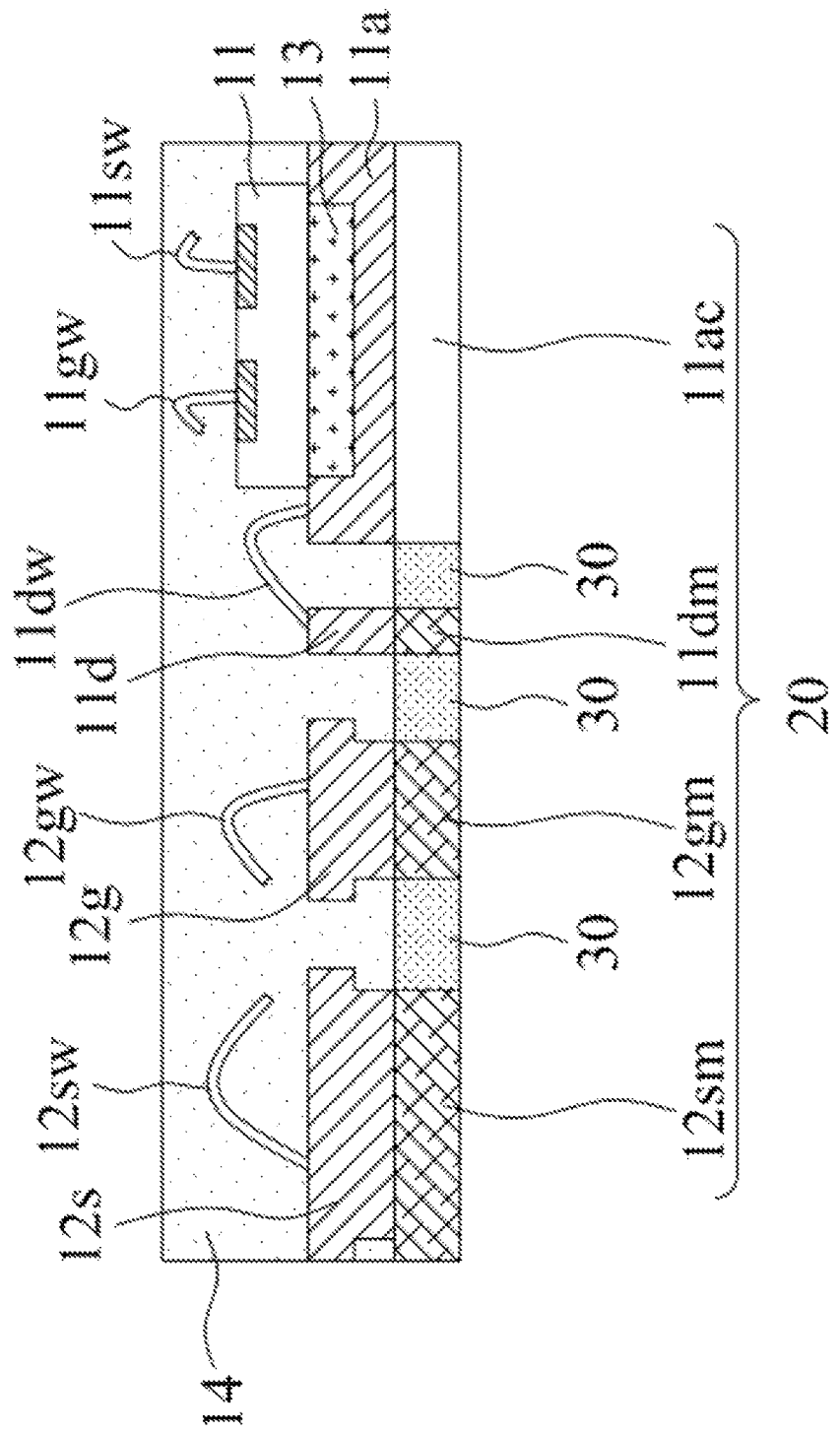

Referring to FIG. 3H, the manufacturing method may include filling the groove 20r with an insulation layer 30. The insulation layer 30 may be formed using atomic layer deposition (ALD), chemical vapor deposition (CVD) or other deposition processes. In some embodiments, a grinding process, such as chemical mechanical polishing (CMP), may be performed to grind and remove a portion of the insulation layer 30 that is outside the groove 20r.

In some embodiments, the manufacturing method may include performing singulation to separate individual structures. This may be done by using, e.g., a dicing saw, laser, or other appropriate cutting technologies. The semiconductor structure formed using the above steps may be the same as the semiconductor chip package 1a shown in FIG. 1A.

Figure 4:
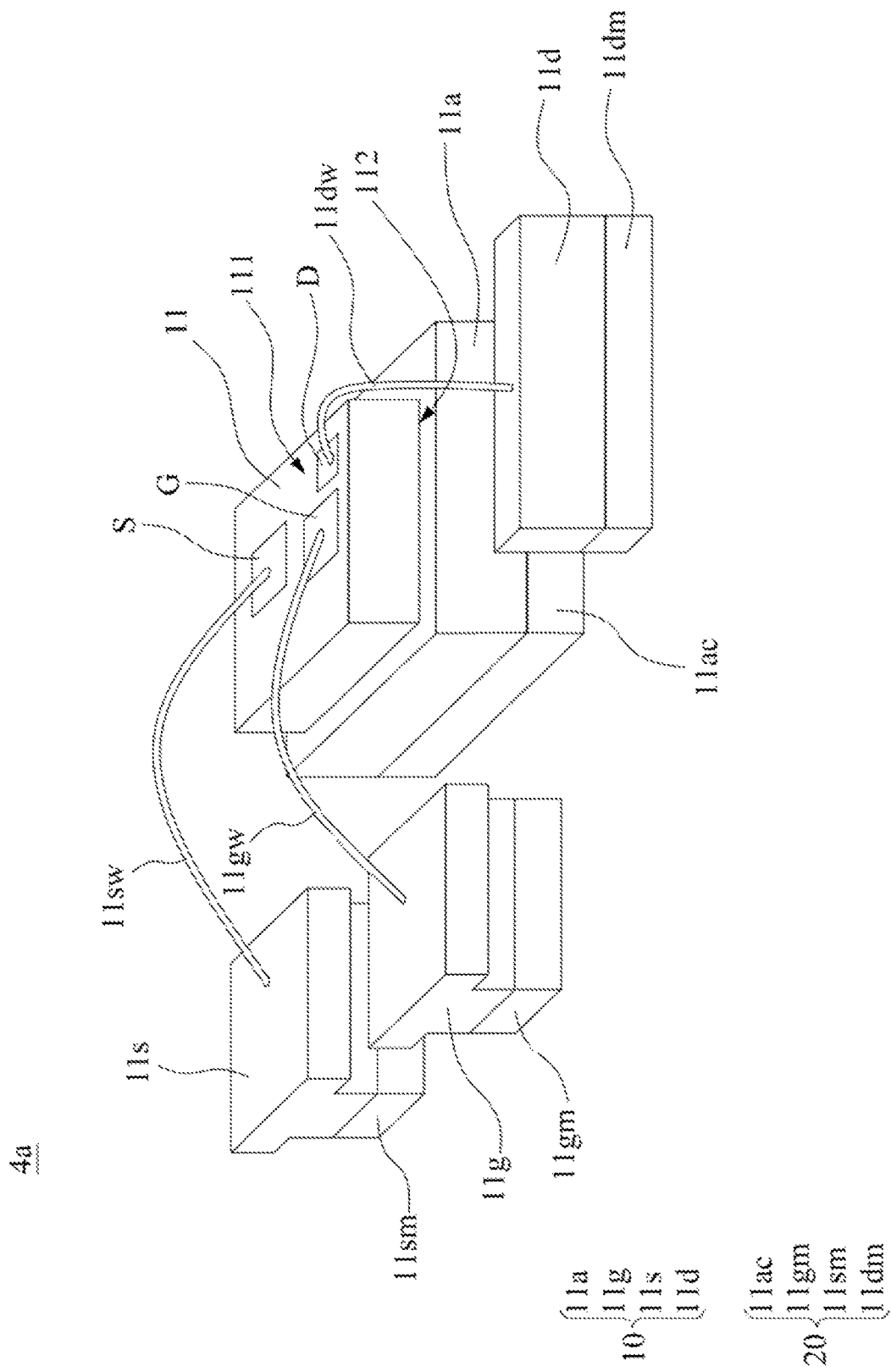
FIG. 4 is a perspective view of a portion of another example semiconductor chip package according to some embodiments of the present disclosure.

FIG. 4 is a perspective view of a portion of an example semiconductor chip package 4a according to embodiments of the present disclosure. The semiconductor chip package 4a is similar to the semiconductor chip package 1a as described with respect to FIG. 1A, except that the gate G, source S and drain D of the semiconductor chip 11 of the semiconductor chip package 4a are located at the same side, such as the surface 111, of the semiconductor chip 11. The drain D may be coupled (or electrically connected) to the drain lead contact 11d of the lead frame 10 via the wire 11dw.

Figure 5:
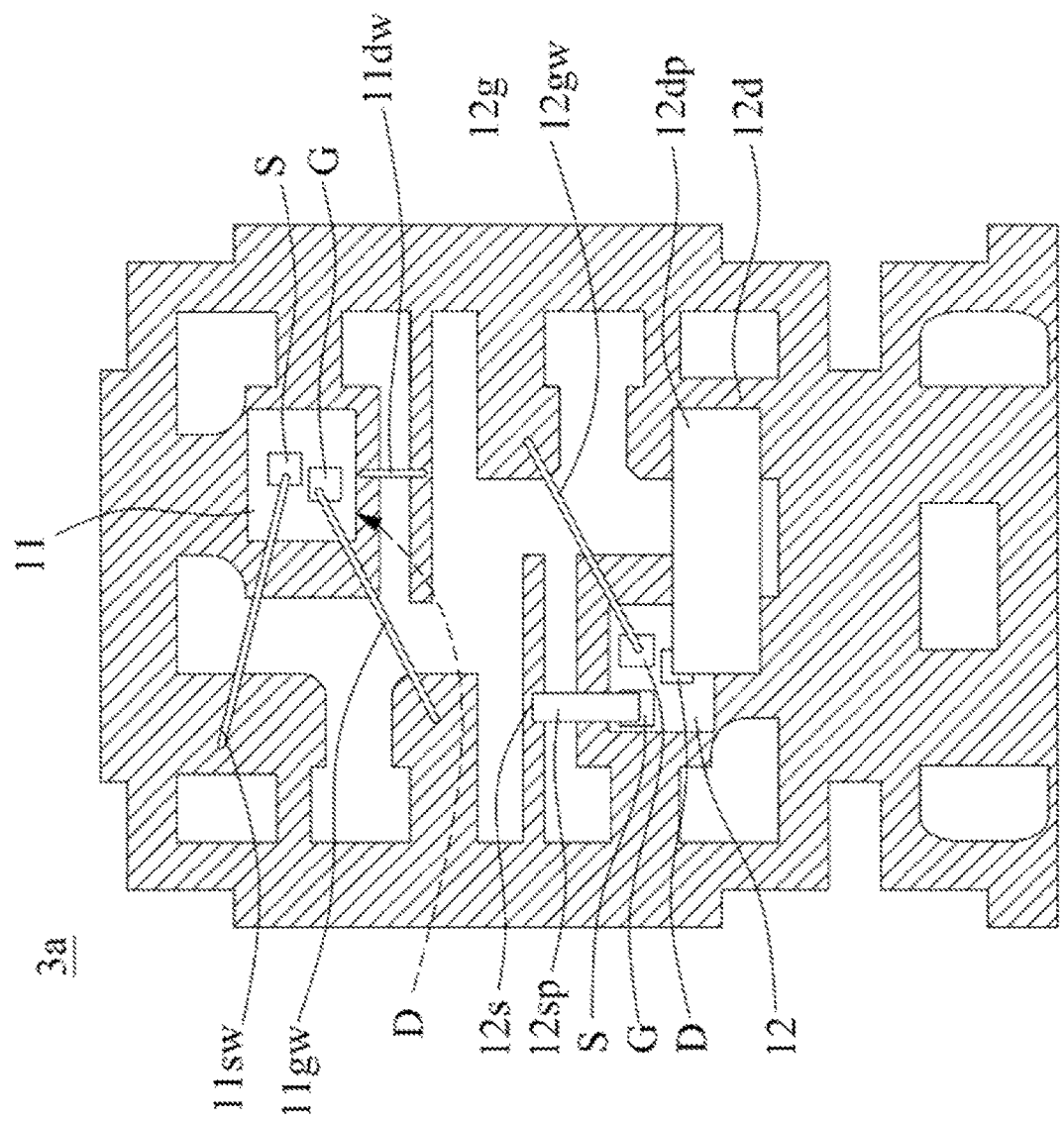
FIG. 5 is a diagram illustrating one or more stages in another example manufacturing method of a semiconductor chip package according to some embodiments of the present disclosure.

FIG. 5 illustrates one or more stages in an example manufacturing method of a semiconductor chip package according to embodiments of the present disclosure. FIG. 5 is similar to FIG. 3E-1, except that the gate G, source S and drain D of the semiconductor chip 12 in FIG. 5 are located at the same side. The drain D may be coupled (or electrically connected) to the drain lead contact 11d of the lead frame 10 via a copper strip 12dp. The source S may be coupled (or electrically connected) to the source lead contact 12s of the lead frame 10 via a copper strip 12sp.

Figure 6:
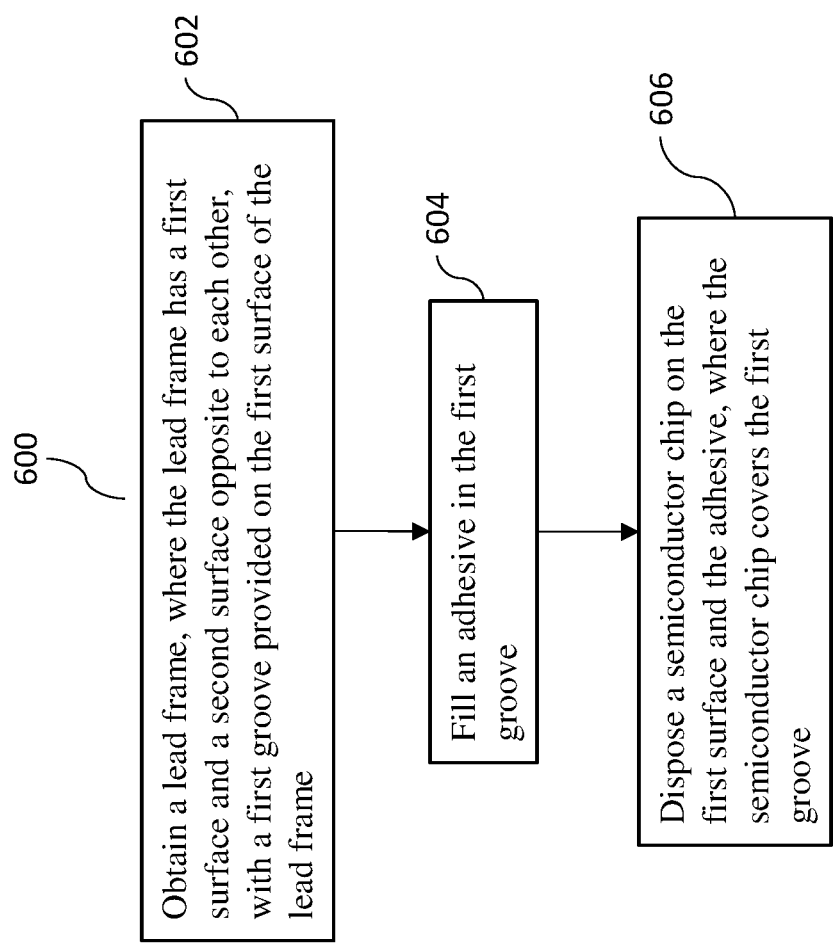
FIG. 6 is a flowchart of a method for manufacturing a semiconductor chip package according to some embodiments of the present disclosure.

FIG. 6 is a flowchart of an embodiment method 600 for manufacturing a semiconductor chip package. The semiconductor chip package may be similar to those described above, e.g., the semiconductor chip package 1a, or 3a. The method 600 may include obtaining a lead frame, where the lead frame has a first surface and a second surface opposite to each other, with a first groove provided on the first surface of the lead frame (block 602). The method 600 may further include filling an adhesive in the first groove (block 604). The method 600 may include disposing a semiconductor chip on the first surface and the adhesive, where the semiconductor chip covers the first groove (block 606).

The method 600 may also include other steps as discussed above for manufacturing the semiconductor chip package. For example, the method 600 may include disposing a carrier on the second surface of the lead frame. Disposing the carrier may include affixing the lead frame to the carrier using a clamping device, where the clamping device is disposed on the first surface of the lead frame. In an example, the carrier may include a first portion and a second portion, where the first portion has a thermal conductivity coefficient greater than that of the second portion. The method 600 may further include removing a portion of the second portion of the carrier such that the first portion and the second portion are not in contact with each other, and forming the second portion into three external terminals of the semiconductor chip package, where the three external terminals are separated from each other. The method 600 may further include filling an insulation layer in between the three external terminals. The method 600 may further include coupling a drain of the semiconductor chip to a drain lead contact of the lead frame via a wire. The method 600 may also include encapsulating, using an encapsulant, the lead frame and the semiconductor chip, where the encapsulant is filled in a second groove provided on the second surface of the lead frame.

In this disclosure, for description convenience, spatially relative terms such as "below", "under", "lower", "above", "upper", "left side", "right side", and so on, may be used to describe the relationship of one component or feature with another one or more components or features, as shown in the accompanying drawings. The spatially relative terms are not only used to depict the orientations in the accompanying drawings, but also intended to encompass different orientations of a device in use or operation. A device may be oriented in other ways (rotated 90 degrees or in other orientations), and the spatially relative terms used herein may be interpreted in a corresponding way similarly. It should be understood that when a component is referred to as being "connected" or "coupled" to another component, it can be directly connected or coupled to another component or an intervening component may be present.

As used herein, the terms "approximately", "basically", "substantially" and "about" are used to describe and account for small variations. When used in conjunction with an event or instance, the terms may refer to an embodiment of exact occurrence of an event or instance as well as an embodiment where the event or instance is close to the occurrence. As used herein with respect to a given value or range, the term "about" generally means being within ±10%, ±5%, ±1%, or ±0.5% of the given value or range. A range herein may be referred to as being from one endpoint to the other or as being between two endpoints. All ranges disclosed herein are inclusive of the endpoints unless otherwise indicated. The term "generally coplanar" may mean that the difference of positions of two surfaces with reference to the same plane is within a few micrometers (μm), e.g., within 10 μm, within 5 μm, within 1 μm, or within 0.5 μm. When values or characteristics are referred to as being "generally" the same, the term may refer to a value that is within ±10%, ±5%, ±1%, or ±0.5% of the mean of the values.

The foregoing has outlined features of some embodiments and detailed aspects of present disclosure. The embodiments described in the present disclosure may be readily used as a basis for designing or modifying other processes and structures in order to carry out the same or similar purposes and/or to achieve the same or similar advantages of the embodiments presented herein. Such equivalent constructions do not depart from the spirit and scope of the present disclosure, and various changes, substitutions, and alterations can be made without departing from the spirit and scope of the present disclosure.

Although the description has been described in detail, it should be understood that various changes, substitutions and alterations can be made without departing from the spirit and scope of this disclosure as defined by the appended claims. Moreover, the scope of the disclosure is not intended to be limited to the particular embodiments described herein, as one of ordinary skill in the art will readily appreciate from this disclosure that processes, machines, manufacture, compositions of matter, means, methods, or steps, presently existing or later to be developed, may perform substantially the same function or achieve substantially the same result as the corresponding embodiments described herein. Accordingly, the appended claims are intended to include within their scope such processes, machines, manufacture, compositions of matter, means, methods, or steps.

What is claimed is:

1. A semiconductor chip package, comprising:
   a lead frame having a first surface and a second surface opposite to each other;
   a first groove provided on the first surface of the lead frame and filled with an adhesive; and
   a semiconductor chip disposed on the first surface, wherein the semiconductor chip is over the first groove and affixed on the lead frame through the adhesive in the first groove; and
   wherein the lead frame further comprises:
   a chip pad, on which the first groove is provided and the semiconductor chip is affixed; and
   a drain lead contact separated from the chip pad.

2. The semiconductor chip package of claim 1, wherein the adhesive in the first groove is completely covered by the semiconductor chip.

3. The semiconductor chip package of claim 1, further comprising:
   a second groove provided on the second surface of the lead frame and filled with an encapsulant.

4. The semiconductor chip package of claim 1, wherein the semiconductor chip comprises:
   a gate and a source provided on a first surface of the semiconductor chip; and
   a drain provided on a second surface of the semiconductor chip opposite to the first surface of the semiconductor chip, the second surface of the semiconductor chip facing the first surface of the lead frame, and the drain being coupled to the drain lead contact via the adhesive, the chip pad and a wire.

5. The semiconductor chip package of claim 1, further comprising:
   a carrier provided on the second surface of the lead frame for carrying the lead frame and the semiconductor chip.

6. The semiconductor chip package of claim 5, wherein the carrier comprises:
   a first portion; and
   a second portion, wherein the first portion has a thermal conductivity coefficient greater than that of the second portion.

7. The semiconductor chip package of claim 6, wherein the first portion of the carrier overlaps with the semiconductor chip, and the second portion of the carrier does not overlap with the semiconductor chip.

8. The semiconductor chip package of claim 6, wherein the second portion of the carrier comprises three external terminals of the semiconductor chip package.

9. The semiconductor chip package of claim 6, wherein the first portion of the carrier comprises a ceramic portion, and the second portion comprises a metal portion.

10. A semiconductor chip package, comprising:
    a lead frame having a first surface and a second surface opposite to each other, with a first groove provided on the first surface of the lead frame;
    an adhesive filled in the first groove;
    a semiconductor chip disposed on the first surface and the adhesive; and
    a carrier provided on the second surface of the lead frame carrying the lead frame and the semiconductor chip; and
    wherein the lead frame further comprises:
    a chip pad, on which the first groove is provided and the semiconductor chip is affixed; and
    a drain lead contact separated from the chip pad.

11. The semiconductor chip package of claim 10, wherein the carrier comprises:
    a first portion; and
    a second portion, wherein the first portion has a thermal conductivity coefficient greater than that of the second portion.

12. The semiconductor chip package of claim 11, wherein the first portion of the carrier overlaps with the semiconductor chip, and the second portion of the carrier does not overlap with the semiconductor chip.

13. The semiconductor chip package of claim 11, wherein the second portion of the carrier comprises three external terminals of the semiconductor chip package.

14. A method for manufacturing a semiconductor chip package, comprising:
    obtaining a lead frame, wherein the lead frame has a first surface and a second surface opposite to each other, with a first groove provided on the first surface of the lead frame;
    filling an adhesive in the first groove; and
    disposing a semiconductor chip on the first surface and the adhesive, wherein the semiconductor chip covers the first groove; and
    wherein the lead frame further comprises: a chip pad, on which the first groove is provided and the semiconductor chip is affixed; and a drain lead contact separated from the chip pad.

15. The method of claim 14, further comprising:
    disposing a carrier on the second surface of the lead frame.

16. The method of claim 15, wherein disposing the carrier comprises:
    affixing the lead frame to the carrier using a clamping device, wherein the clamping device is disposed on the first surface of the lead frame.

17. The method of claim 15, wherein the carrier comprises:
    a first portion; and
    a second portion, wherein the first portion has a thermal conductivity coefficient greater than that of the second portion.

18. The method of claim 17, further comprising:
    removing a portion of the second portion of the carrier such that the first portion and the second portion are not in contact with each other.

19. The method of claim 18, further comprising:
    forming the second portion into three external terminals of the semiconductor chip package, wherein the three external terminals are separated from each other.

* * * * *